(12) United States Patent
Takamura et al.

(10) Patent No.: US 6,666,729 B2
(45) Date of Patent: Dec. 23, 2003

(54) JOINT CONNECTOR HAVING PLURAL CONNECTING UNITS AND A JOINT PLATE

(75) Inventors: Yoshikatsu Takamura, Yokkaichi (JP); Yukimitsu Hattori, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 226 days.

(21) Appl. No.: 09/900,012

(22) Filed: Jul. 9, 2001

(65) Prior Publication Data

US 2002/0004322 A1 Jan. 10, 2002

(30) Foreign Application Priority Data

Jul. 10, 2000 (JP) ........................................ 2000-208177

(51) Int. Cl.$^7$ .............................................. H01R 11/09
(52) U.S. Cl. ......................................... 439/723; 439/44
(58) Field of Search ................................ 439/189, 723, 439/724, 725, 44, 76.2, 507, 949

(56) References Cited

U.S. PATENT DOCUMENTS

| | | | |
|---|---|---|---|
| 4,790,760 A | | 12/1988 | Kreinberg |
| 4,975,088 A | | 12/1990 | Brandstäter et al. |
| 5,525,063 A | | 6/1996 | McMichen et al. |
| 5,645,455 A | * | 7/1997 | Seki ........................ 439/189 X |
| 5,759,052 A | * | 6/1998 | Seki ........................... 439/189 |
| 6,508,656 B2 | * | 1/2003 | Chevassus-More et al. . 439/723 X |

FOREIGN PATENT DOCUMENTS

| | | |
|---|---|---|
| DE | 1227961 | 11/1966 |
| DE | 4235876 | 4/1994 |
| EP | 0749183 | 12/1996 |
| JP | 8-306451 | 11/1996 |

OTHER PUBLICATIONS

English Language Abstract of DE 42 35 876, Apr. 28, 1994.
English Language Abstract of JP 8–306451, Nov. 22, 1996.

* cited by examiner

Primary Examiner—Lynn Feild
Assistant Examiner—Son V. Nguyen
(74) Attorney, Agent, or Firm—Greenblum & Bernstein, P.L.C.

(57) ABSTRACT

A joint connector includes a connecting unit provided with a bus bar on an insulating plate. The bus bar includes a joint area connecting plural pressure welding areas of the bus bar, to which wires may be pressure welded. The joint connector also includes a joint plate with plural pressure welding slots in which connecting units may be inserted to establish connection between the joint plate and joint areas of the connecting units. By stacking plural pressure-welded connecting units and pressure fitting their insulating plates into pressure welding slots of a joint plate, wires pressure-welded to upper and lower connecting units are connected together.

9 Claims, 9 Drawing Sheets

JOINT CONNECTOR HAVING PLURAL CONNECTING UNITS AND A JOINT PLATE

BACKGROUND OF THE INVENTION

1. Field of the Invention

The present invention relates to a joint connector which allows mutual connection between cables to be more flexible in accordance with various circuit connecting configurations. Note that the terms "cable" and "wire" are used interchangeably throughout the present disclosure.

2. Description of Background Information

Figure 8A:
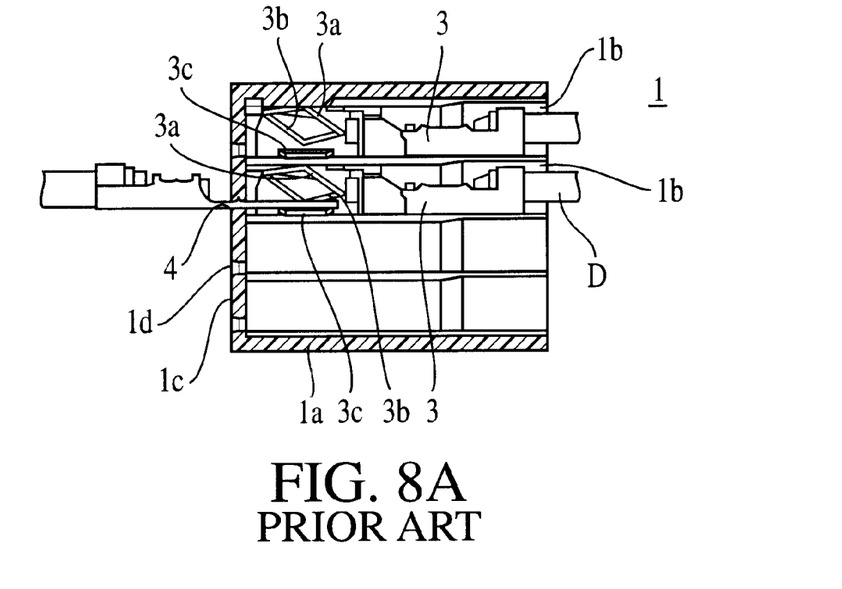
FIG. 8A is a cross-sectional view of a known joint connector.
Figure 8B:
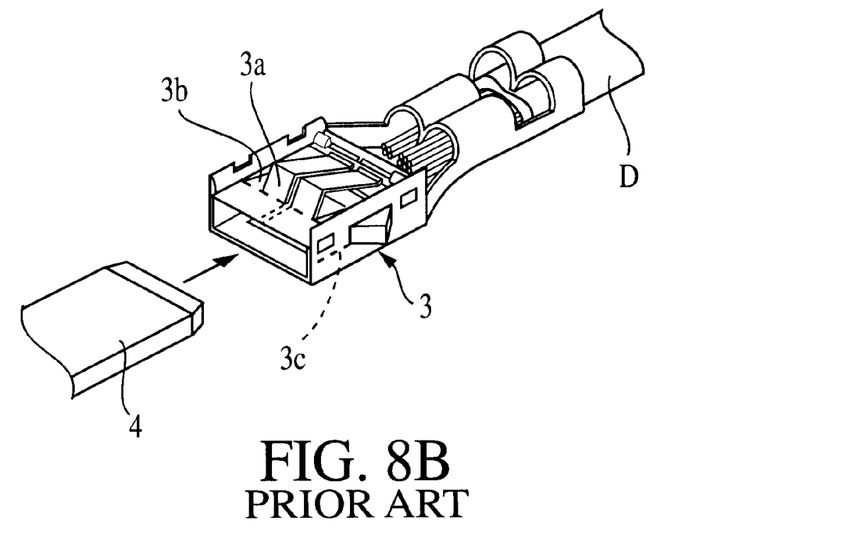
FIG. 8B is a perspective view of a terminal used for a known joint connector.

Joint connectors have conventionally been used for connecting the cables to be used for common circuit systems such as grounding lines. A joint connector 1 shown in FIG. 8A is disclosed in Japanese Unexamined Patent Publication No. (Hei) 8-306451. This joint connector 1 is assembled by inserting a connecting terminal 3 as shown in FIG. 8B in a terminal housing space 1b in a connector housing 1a.

The aforementioned connector housing 1a has a plurality of terminal housing spaces 1b at different levels (shown as 4 levels in FIG. 8A) and is equipped with an inserting inlet 1d for each of the respective terminal housing spaces 1b at the front face 1c of connector housing 1a. The connecting terminal 3 is provided with a lower connector portion 3c, a first elastic contact member 3a on an upper area thereof, and a second elastic contact member 3b located in a middle area between the lower connector portion 3c and the upper first contact member 3a.

In such a connector housing 1a, connecting terminals 3 inserted in housing spaces 1b above and below one another are placed in contact with each other by abutting the first elastic contact member 3a of the lower connecting terminal 3 with the connector portion 3c of the upper connecting terminal 3. In addition, insertion of a male terminal 4 through insertion hole 1d at the front face 1c of the connector housing allows for connection with contact with the second elastic contact member 3b of a connecting terminal 3. Such a configuration allows for easier adaptation to increases in the number of connections to be made due to circuit modifications.

Figure 9:
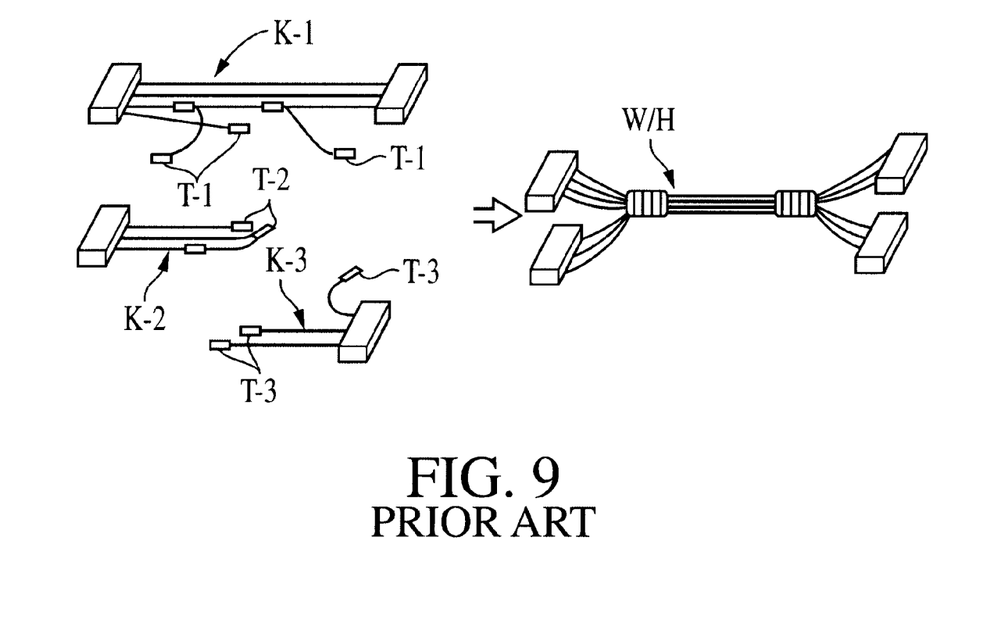
FIG. 9 is a schematic diagram depicting assembling of a conventional sub-assembly harness and a final assembly wire harness.

When assembling a wire harness, as shown in FIG. 9, sub-assembly harnesses K-1, K-2 and K-3 are initially sub-assembled. At this stage the terminals T-1, T-2 and T-3 of cables which are to be connected to other sub-assembly harnesses during final assembling remain unconnected. These temporarily bound sub-assembly harnesses are finally assembled with the use of an assembling board, and at that time the unconnected terminals T-1, T-2 and T-3 are inserted into connectors of other sub-assembly harnesses. Therefore, when carrying out such final assembling, there is a lack of assembling efficiency due to the need for the final assembling of terminals. Furthermore, the initial assembling of the sub-assembly harnesses and the final assembling of the wire harness W/H are usually carried out in different places. Therefore, unconnected terminals T1, T-2 and T-3 are subjected to deformation and damage during transportation of the aforementioned sub-assembly harnesses K-1, K-2 and K3 prior to final assembling. Such deformation or damage of the terminals leads to difficult insertion into the connectors during final assembling, as well as possible inability to carry out terminal insertion.

Accordingly, with the aforementioned joint connector 1, because the connecting terminals 3 are individually inserted into one connector housing 1a, the aforementioned problem of final terminal assembling cannot be solved. In addition, there are further problems created by the special form of connecting terminal 3 which cannot optionally select connection or non-connection between the upper and lower terminals.

SUMMARY OF THE INVENTION

There is provided a connecting unit which includes a bus bar on an insulating plate, the bus bar including a joint area which connects between plural pressure welding areas of the bus bar. The pressure welding areas of the bus bar are provided with pressure weld blades which receive the ends of wires for pressure welding thereto.

In addition, a joint plate is separately provided which is equipped with a plurality of pressure welding slots which allow connection with a joint area by insertion of a connecting unit within a slot.

By stacking plural pressure-welded connecting units, and by pressure-fitting the insulating plates of the connecting units into pressure welding slots of a joint plate, wires pressure-welded to upper and lower connecting units are connected together.

The present invention addresses the aforementioned problems associated with wire harness assembling by eliminating final assembling of terminals to sub-assembly harnesses, and provides a joint connector that allows flexible adaptation to an increase in the number of connecting cables to be joined or circuit modifications.

In order to achieve the aforementioned objectives, the present invention provides a joint connector which includes a connecting unit and a joint plate. The connecting unit is provided with a generally flat insulating plate and a bus bar arranged in accordance with a predetermined circuit pattern on the insulating plate. The bus bar includes a plurality of pressure welding areas having pressure weld blades which allow pressure-welding of cables thereon. The bus bar also includes a joint area that connects respective predetermined pressure welded areas. The joint plate has plural contactable pressure welding slots in which the aforementioned insulation plates of the connecting units may be inserted.

By stacking plural connecting units which have cables pressure welded to their pressure welding areas, and by press-fitting the connecting units into the pressure welding slots of the aforementioned joint plate, the respective cables pressure-welded to upper and lower connecting units are connected together.

Based on the aforementioned structure, each cable can be connected together through bus bars by merely pressure-welding a plural number of cables to the pressure welding area of a connecting unit. Furthermore, by press fitting each connecting unit into pressure welding slots of a joint plate, the bus bars between plural connecting units are connected together through the joint plate. Thus, cables that are pressure welded to plural connecting units can be connected together through bus bars and joint plates.

Furthermore, by connecting the cable terminals which are to be joined with other sub-assembly harnesses to pressure welding areas of the aforementioned connecting unit, they are easily integrated by being stacked and connected with other sub-assembly harnesses at the time of final assembling of the wire harness. Thus, the respective cables between sub-assembly harnesses are connected together through respective bus bars which are connected between upper and lower connecting units by a joint plate. Therefore, by connecting cable terminals to connecting units during assembling of the sub-assembly harnesses, the final assembling of terminals can be eliminated by the provision of complete sub-assembly harnesses with no unconnected terminals.

Further, by optionally arranging the positions of the pressure welding slots in the joint plate, the connecting units to be connected together (and thus the pressure welding areas to be connected together) can optionally be selected. In addition, even within the same connecting unit, by optionally arranging the route of the bus bar, the pressure welding areas to be connected together (and thus the cables to be connected together) can also be selected.

Preferably, the joint connector includes a case which accommodates plural connecting units stacked therein, and includes guide grooves that guide connecting units into predetermined upper and lower positions formed in the case. The connecting units are inserted into the case along the guiding grooves, thereby enabling press-fitting into the pressure welding slots of the aforementioned joint plate.

With the arrangement described above, the connecting units that are stacked and connected between required cables can integrally be held and fastened to the required part of the wire harness.

DETAILED DESCRIPTION OF THE PRESENT INVENTION

Description follows below of the embodiment of the present invention in reference to the drawings.

Figure 1:
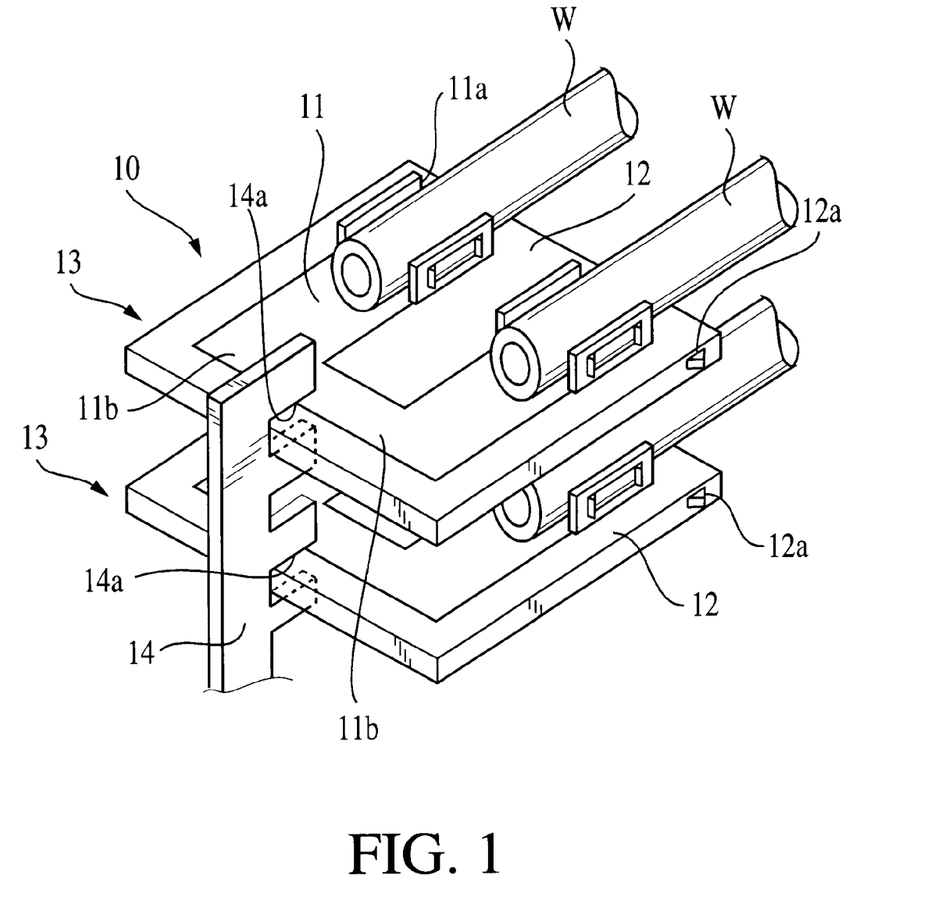
FIG. 1 is a perspective view of a joint connector of the present invention.

FIG. 1 shows an embodiment of a joint connector 10, which includes a connecting unit 13 in which a bus bar 11 with pressure welding areas 11a that allow pressure-welding with the terminals of cables W is arranged and fastened to a generally flat insulating plate 12, and which also includes a joint plate 14 which connects between respective bus bars of plural vertically stacked connecting units 13.

Figure 2:
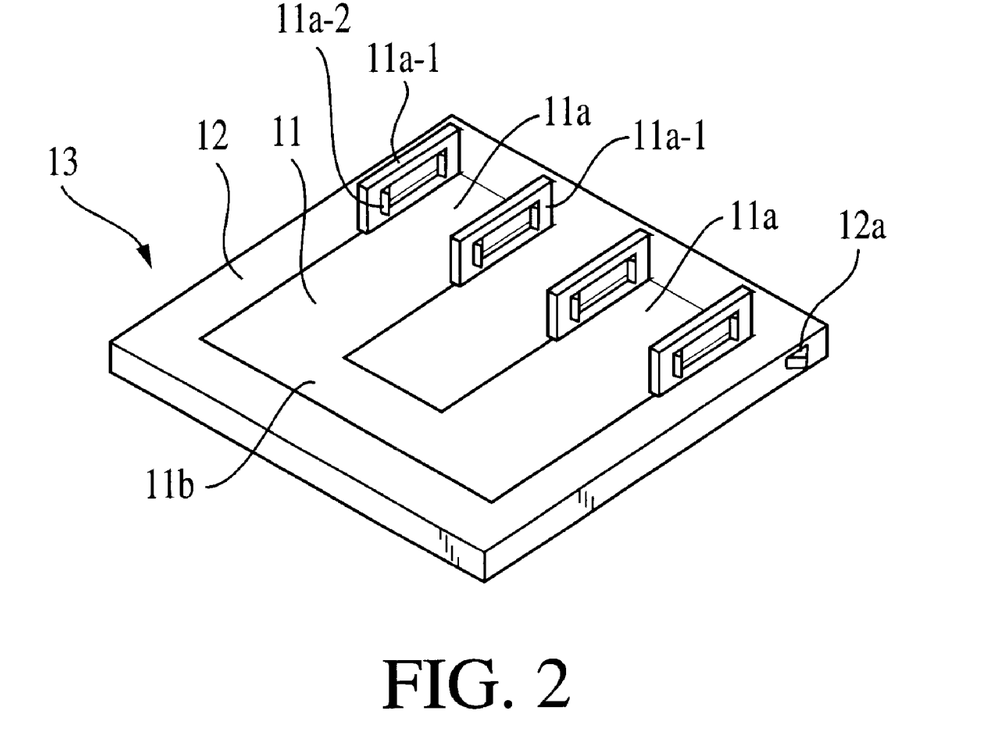
FIG. 2 is a perspective view of a connecting unit of the joint connector of FIG. 1.

As shown in FIG. 2, in each connecting unit 13, a plurality of pressure-welding areas 11a is arranged on one end on the insulating plate 12, and each pressure-welding area 11a includes a pair of side wall areas 11a-1 in which a protruded piece of both base sides of bus bar 11 is folded and bent upwards and two pairs of pressure-welding blades 11a-2 are cut out from the side wall areas 11a-1 and bent inwardly. The bus bar 11 is arranged along a predetermined route that connects a plural number of pressure-welding areas 11a arranged on an insulating plate 12, and is equipped with a joint area 11b for connection with a joint plate 14 at an area opposite to the pressure-welding area 11a on the insulating plate 12. Furthermore, on both sides of the insulating plate 12, securing protrusions 12a are provided that perform a securing function when inserted into a case 15 (note FIG. 4).

The joint plate 14 is formed by die cutting a metallic plate, and can receive an edge area of insulating plate 12 of connecting unit 13 and hold the area from both sides within pressure welding slots 14a that allow connection with the joint areas 11b. As shown in the drawing, a plurality of pressure welding slots 14a are formed corresponding with intervals for respective connecting units 13 when the connecting units 13 are stacked in plural levels.

Figure 3:
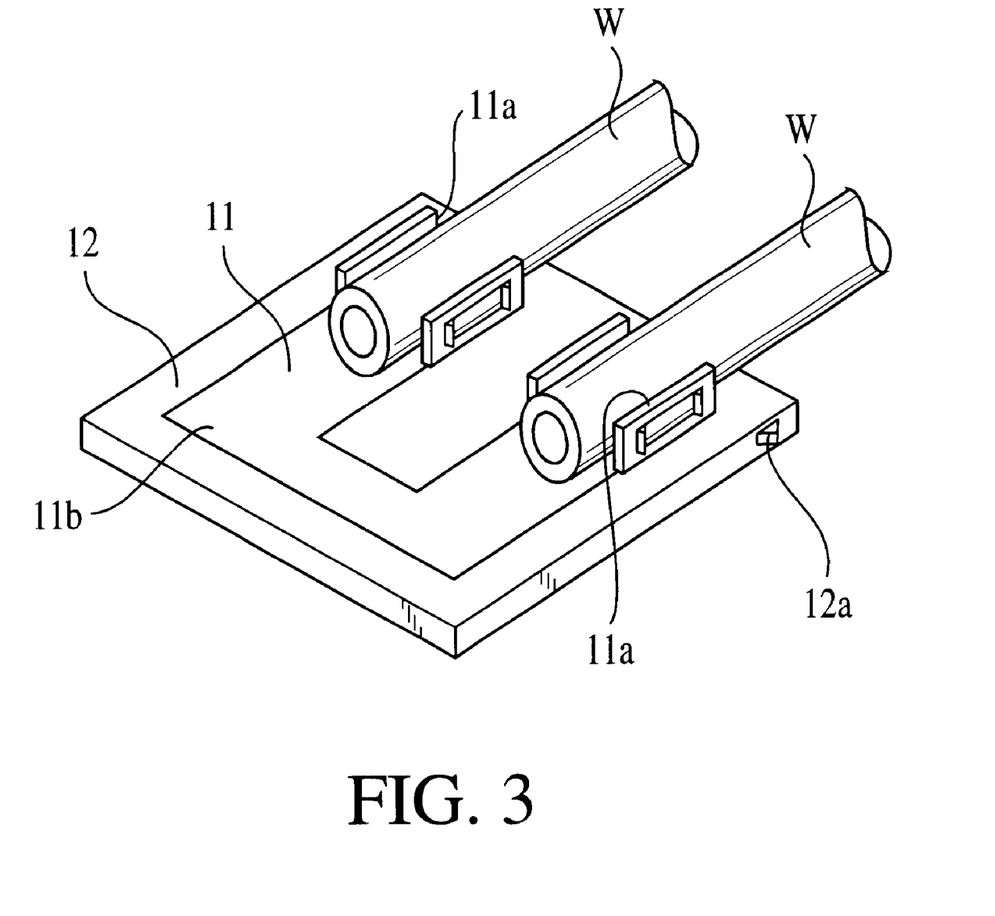
FIG. 3 is a perspective view of wires pressure-welded to a connecting unit of the joint connector of FIG. 1.

Description follows of the manner in which a joint connector 10 with the aforementioned structure may be used for connections between respective sub-assembly harnesses in a wire harness. Initially, as shown in FIG. 3, among the cables W which constitute one sub-assembly harness, those which will later be connected with other sub-assembly harnesses are pressure-welded to pressure-welding areas 11a of a connecting unit 13. Similarly, cables of another sub-assembly harness are connected with a different connecting unit 13. Such a sub-assembly harness is constructed as a complete type by eliminating the need for final assembling of terminals, and is finally assembled on an assembling workbench. In the final assembling process of a wire harness, as shown in FIG. 1, each wire is connected together between respective sub-assembly harnesses by vertically stacking respective connecting units 13 and then connecting respective connecting units 13 by a joint plate 14.

Figure 4:
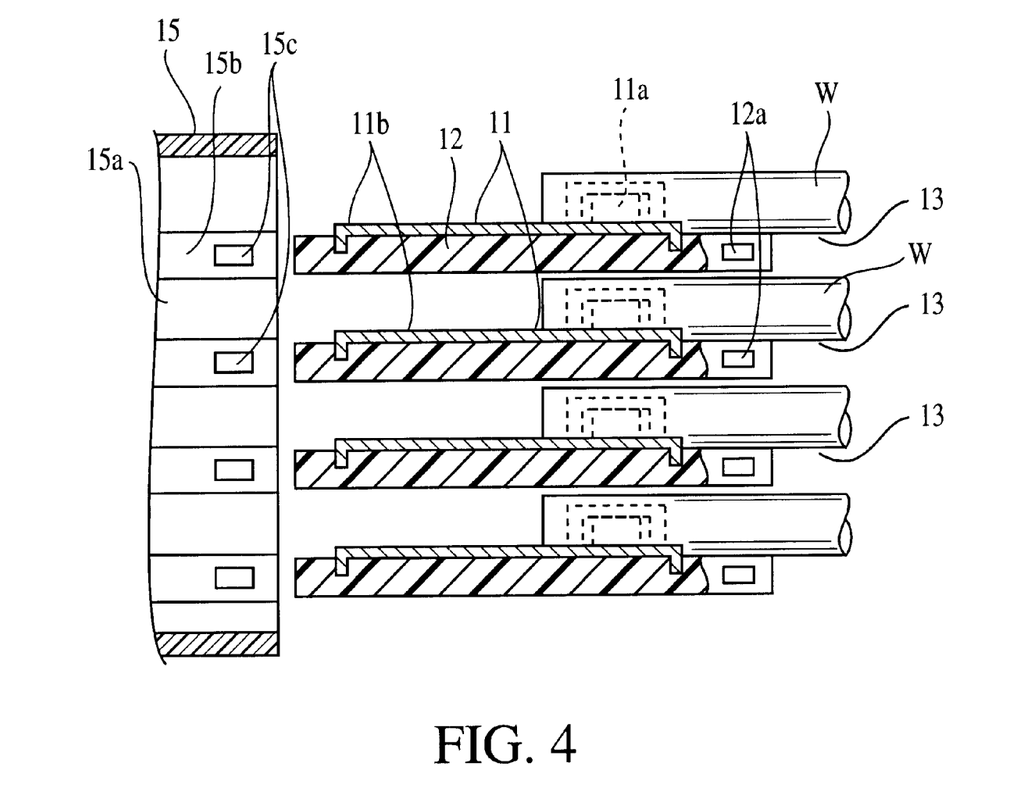
FIG. 4 is a cross-sectional view of stacked connecting units prior to insertion in a case.
Figure 5:
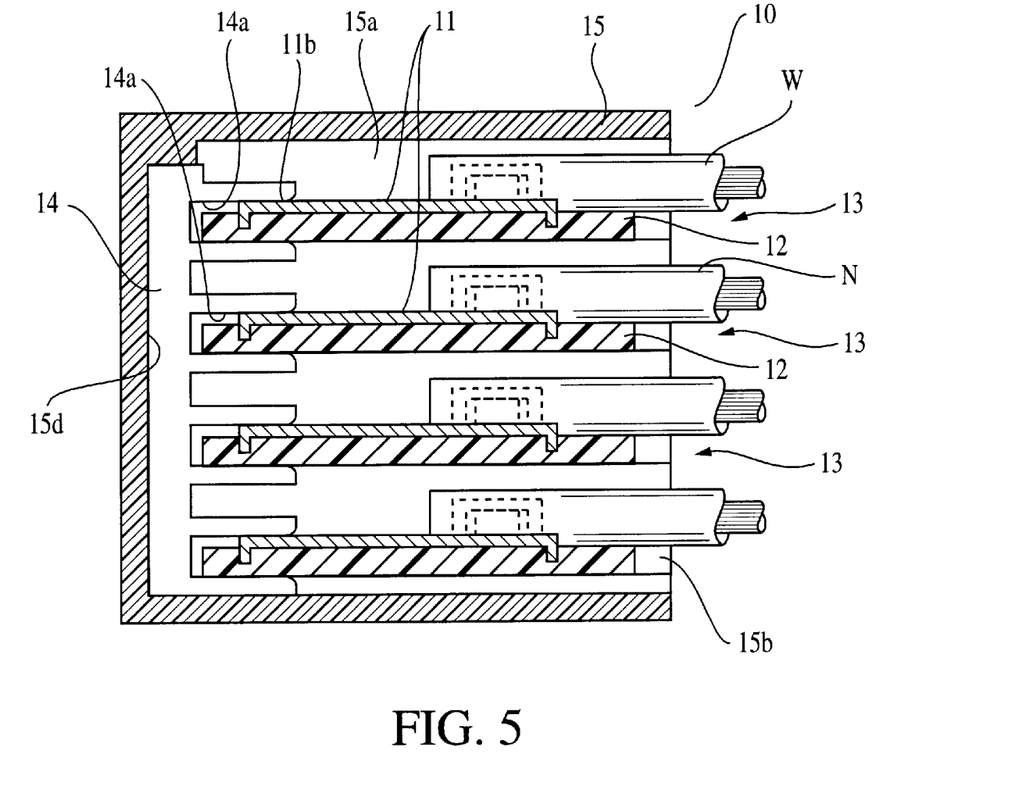
FIG. 5 is a cross-sectional view of connecting units accommodated in a case.

The vertically stacked connecting units 13 may be accommodated in a case 15, as shown in FIG. 4. The case 15 is equipped with an accommodating area 15a that permits accommodation of stacked connecting units, and includes a guiding groove 15b for guiding both sides of insulating plate 12 of each connecting unit 13 during insertion. Furthermore, as a lock for fastening the case 15 and respective connecting units 13 in an accommodated condition, securing protrusions 12a are provided on both sides of insulation plate 12 which enter securing holes 15c. Furthermore, on the case wall face 15d located forwardly in an insertion direction of the connecting units 13, a joint plate 14 is fastened in such a manner that respective pressure welding slots 14a are oppositely disposed between a stacked interval of each connecting unit 13, as shown in FIG. 5.

Each connecting unit 13 in which wires W are pressure welded is gradually inserted into a case 15 along a guiding groove 15b and, at the same time, each stacked connecting unit 13 is inter-fitted into a pressure welding slot 14a of a joint plate 14. With this arrangement, the joint plate 14 and the joint area 11b are connected, thereby making it possible to connect the wires W that are pressure welded with the connecting units 13 at each level.

Figure 6:
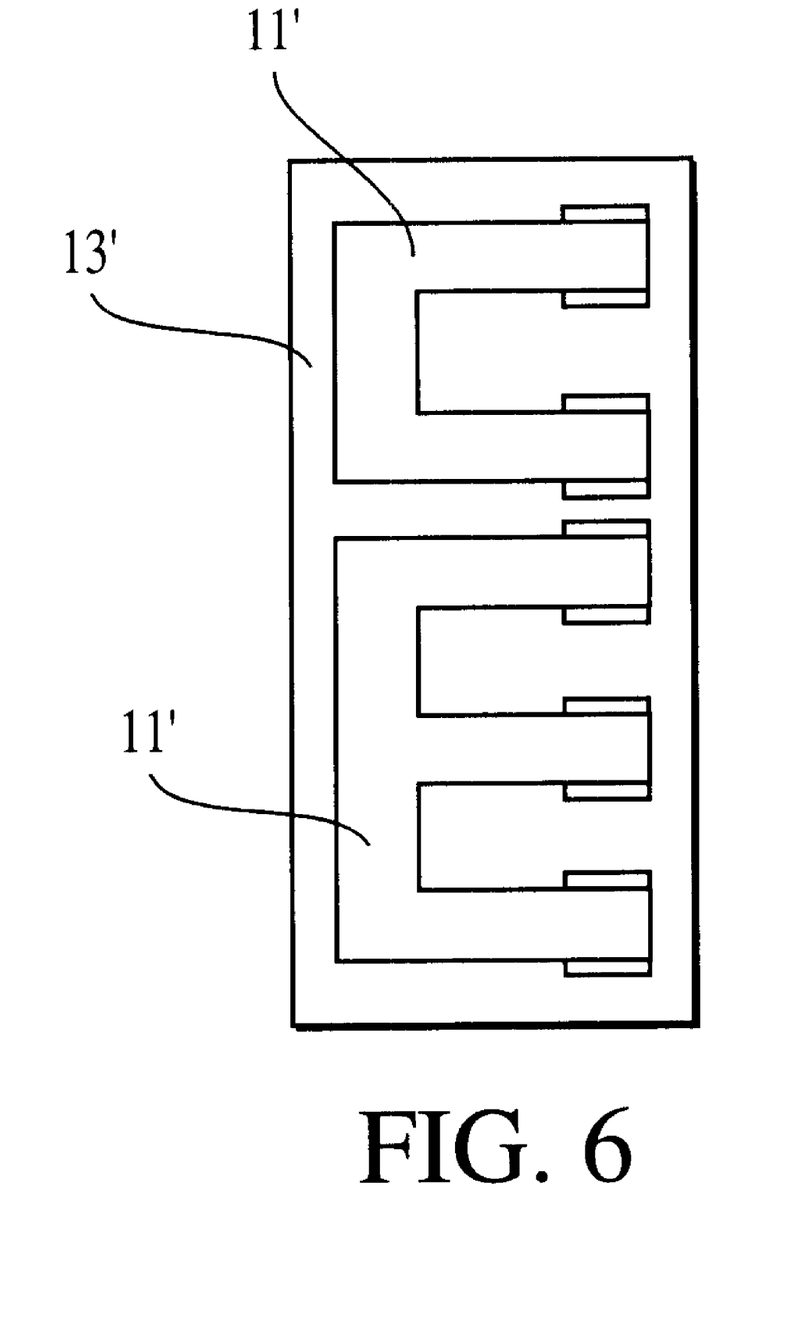
FIG. 6 is a plan view of a modified connecting unit.
Figure 7:
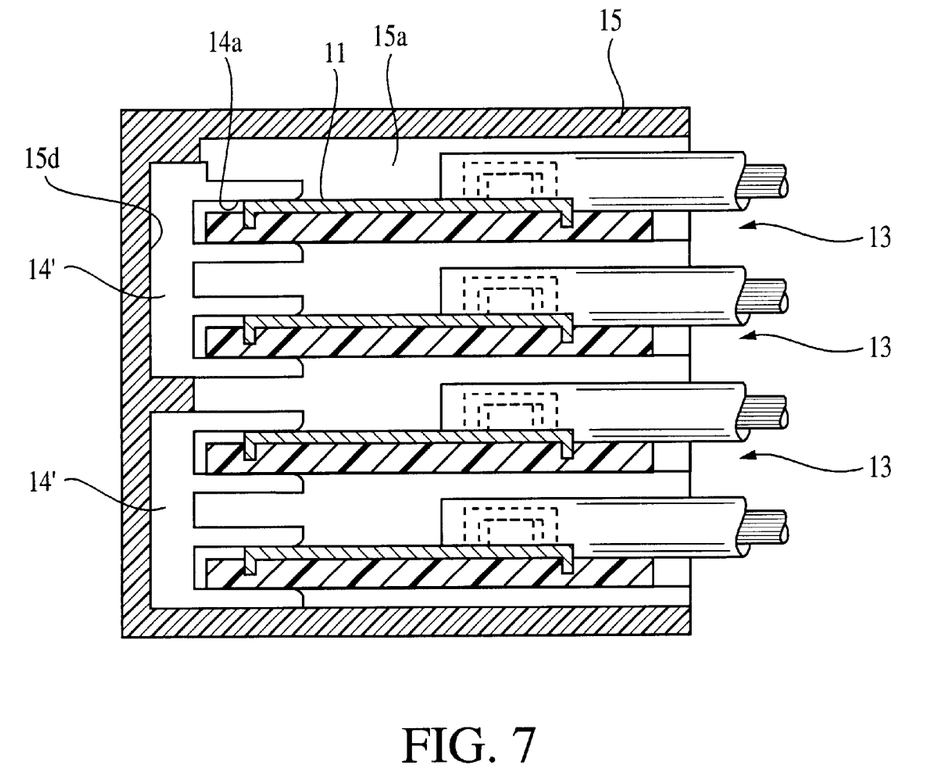
FIG. 7 is a cross-sectional view of connecting units accommodated in a case with a modified joint plate.

The fastening of stacked connecting units 13 may be achieved by providing insulating plates 12 with engaging areas at predetermined intervals instead of using the case 15. In order to prevent removal of the wires W which have been pressure-welded to the pressure welding areas 11a of each connecting unit 13, a barrel for holding wire W to the end area of bus bar 11 may be provided or a fastening piece may be provided on insulating plate 12. In addition, instead of making all of the plural wires W pressure-welded to each connecting unit 13' contact with each other, the route of bus bar 11' may be arranged so that wires are selectively connected together, as shown in FIG. 6. Furthermore, as shown in FIG. 7, a plurality of joint plates 14' can be used by separating them; or arranging the positions of pressure-welding slots 14a to correspond with only the positions of connecting units 13 requiring connection. In such a manner, any one among vertically stacked connecting units 13 can be selectively connected to each other.

As is apparent from the description above, by enabling the wires that had conventionally been assembled during final assembling to be connected with connecting unit at the time of sub-assembling of the sub-assembly harnesses, connection can be carried out with other sub-assembly harnesses by stacking respective connecting units in an integral arrangement at the time of final assembling. Therefore, the final assembling of terminals can be eliminated, and labor as well as time that have conventionally been required for the final assembling of terminals can be reduced, thereby leading to efficient wire harness assembling. Furthermore, damage of terminals in transporting of the sub-assembly harnesses can also be eliminated, thus improving the quality and reliability of wire-harness that can be attained. In addition to this, easy compliance with any alteration to circuits to be jointed can also be achieved.

It is noted that the foregoing examples have been provided merely for the purpose of explanation and are in no way to be construed as limiting of the present invention. While the present invention has been described with reference to certain embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

The present disclosure relates to subject matter contained in priority Japanese Application No. 2000-208177, filed on Jul. 10, 2000, the disclosure of which is herein expressly incorporated by reference in its entirety.

What is claimed:

1. A joint connector comprising:
   at least one connecting unit comprising an insulating plate and a bus bar, said bus bar being mounted on said insulating plate and configured in accordance with a predetermined circuit pattern, said bus bar including plural pressure welding areas configured for pressure welding of wire end portions thereto, said bus bar further including a joint area configured for connecting respective predetermined pressure welding areas; and
   a joint plate having a plurality of pressure welding slots, each of said pressure welding slots being configured to receive the insulating plate of said at least one connecting unit inserted therein;
   wherein respective end portions of a plurality of wires are pressure welded to respective pressure welding areas of a plurality of said connecting units, whereby the plurality of wires are connected when each of the plurality of said connecting units is inserted into a respective one of said pressure welding slots of said joint plate.

2. The joint connector according to claim 1, further comprising a plurality of said connecting units, said insulating plate plates of each of said connecting units being inserted into a respective one of said pressure welding slots of said joint plate, whereby said joint plate connects to said joint areas of said bus bars of each of said connecting units.

3. The joint connector according to claim 1, wherein said pressure welding areas of said bus bar of said at least one connecting unit include pressure weld blades configured for pressure welding of wire end portions thereto.

4. The joint connector according to claim 1, further comprising a case configured to accommodate a plurality of said connecting units stacked therein, said case including a plurality of guide grooves that guide said connecting units into predetermined upper and lower positions in said case during insertion therein, thereby facilitating insertion of said insulating plates of said connecting units into said pressure welding slots of said joint plate.

5. The joint connector according to claim 4, wherein said insulating plates of each of said connecting units include securing protrusions which are receive within securing holes provided in said case for locking said insulating plates in place within said case.

6. A method of assembling a wire harness said method comprising:
   assembling a plurality of separate sub-assembly wire harnesses which include unconnected wire end portions extending therefrom;
   providing a plurality of connecting units which each include an insulating plate and a bus bar, the bus bar being mounted on the insulating plate and configured in accordance with a predetermined circuit pattern, the bus bar including plural pressure welding areas configured for pressure welding of wire end portions thereto, the bus bar further including a joint area configured for connecting respective predetermined pressure welding areas;
   attaching the wire end portions of each of the plurality of separate sub-assembly wire harnesses to the pressure welding areas of the bus bars of separate ones of the plurality of connecting units;
   providing a joint plate having a plurality of pressure welding slots, each of the plurality of pressure welding slots being configured to receive the insulating plate of one of the plurality of connecting units inserted therein; and
   inserting the insulating plates of the plurality of connecting units into the plurality of pressure welding slots of the joint plate so that the joint plate contacts the joint areas of the bus bars of the plurality of connecting units and thereby connects the wire end portions of the plurality of separate sub-assembly wire harnesses which are attached to the plurality of connecting units to form a final wire harness.

7. The method according to claim 6, further comprising attaching the wire end portions of each of the plurality of separate sub-assembly harnesses to pressure weld bars located in the pressure welding areas of the bus bars.

8. The method according to claim 6, further comprising inserting the plurality of connecting units into a case configured to accommodate a stack of the connecting units therein, further including guiding the connecting units into predetermined upper and lower positions in the case during insertion with guide grooves provided in the case, thereby facilitating insertion of the insulating plates of the connecting units into the pressure welding slots of the joint plate.

9. The method according to claim 8, wherein securing protrusions are provided on the insulating plates of the connecting units, further including positioning the securing protrusions within securing holes of the case for locking the insulating plates in place within the case.

* * * * *